(12) United States Patent
Lin et al.

(10) Patent No.: US 9,466,375 B1
(45) Date of Patent: Oct. 11, 2016

(54) MEMORY DEVICE AND PROGRAMMING METHOD THEREOF

(71) Applicant: MACRONIX International Co., Ltd., Hsinchu (TW)

(72) Inventors: Che-Shih Lin, Hsinchu (TW); Yao-Wen Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/724,605

(22) Filed: May 28, 2015

(51) Int. Cl.
G11C 16/04 (2006.01)
G11C 16/10 (2006.01)
G11C 16/08 (2006.01)
G11C 16/30 (2006.01)

(52) U.S. Cl.
CPC ........... *G11C 16/10* (2013.01); *G11C 16/0483* (2013.01); *G11C 16/08* (2013.01); *G11C 16/30* (2013.01)

(58) Field of Classification Search
CPC ... G11C 16/10; G11C 16/0483; G11C 16/08; G11C 16/30
USPC ....................................... 365/185.17, 185.02
See application file for complete search history.

(56) References Cited

U.S. PATENT DOCUMENTS

| | | | |
|---|---|---|---|
| 6,487,117 B1 | 11/2002 | Choi et al. | |
| 8,036,043 B2 | 10/2011 | Oh et al. | |
| 8,395,939 B2 | 3/2013 | Vali et al. | |
| 8,427,881 B2 | 4/2013 | Jang et al. | |
| 8,514,621 B2 | 8/2013 | Choi et al. | |
| 8,923,061 B2 * | 12/2014 | Kim .................. | G11C 16/0483 365/185.17 |
| 2010/0172182 A1 * | 7/2010 | Seol .................... | G11C 11/5628 365/185.17 |
| 2011/0286276 A1 * | 11/2011 | Lin ..................... | G11C 16/0483 365/185.18 |
| 2011/0292725 A1 | 12/2011 | Choi et al. | |
| 2011/0305081 A1 * | 12/2011 | Lee .................... | G11C 11/5628 365/185.03 |
| 2011/0310666 A1 * | 12/2011 | Miida .................. | G11C 16/10 365/185.11 |
| 2013/0250689 A1 * | 9/2013 | Lai ...................... | G11C 11/5628 365/185.17 |
| 2013/0258745 A1 * | 10/2013 | Tanzawa ............... | G11C 16/08 365/72 |
| 2014/0301146 A1 * | 10/2014 | Kaza ................... | G11C 16/08 365/185.23 |
| 2015/0294726 A1 * | 10/2015 | Sim .................... | G11C 16/10 365/185.12 |
| 2016/0071599 A1 * | 3/2016 | Hsu ..................... | G11C 16/10 365/185.12 |

OTHER PUBLICATIONS

"Office Action of Taiwan Counterpart Application", issued on Jun. 15, 2016, p. 1-p. 7, in which the listed reference was cited.

* cited by examiner

*Primary Examiner* — Toan Le
(74) *Attorney, Agent, or Firm* — J.C. Patents

(57) ABSTRACT

A memory device and a programming method thereof are provided, and the programming method for the memory device includes following steps. During a first period, a first voltage from a common source line is transmitted to first ends of a first memory cell string and a second memory cell string, and second ends of the first and the second memory cell strings are floated. During a second period, the first ends of the first and the second memory cell strings are floated, a second voltage and a third voltage are respectively transmitted to the second ends of the first and the second memory cell strings, and a programming voltage and a plurality of passing voltages are applied, so as to inhibit programming of the first memory cell string and sequentially program a plurality of memory cells in the second memory cell string from a second side of a memory array.

10 Claims, 4 Drawing Sheets

MEMORY DEVICE AND PROGRAMMING METHOD THEREOF

BACKGROUND OF THE INVENTION

1. Field of the Invention

The invention relates to a device and an operating method thereof, and more particularly, to a memory device and a programming method thereof.

2. Description of Related Art

A flash memory generally adopts the memory array of a NAND or a NOR architecture, wherein the NAND memory array is popular due to the suitability thereof in the application of high-density data storage. In general, a NAND memory array includes a plurality of memory cell strings, and each of the memory cell strings is electrically connected between a corresponding bit line and common source line. Moreover, the programming method of the NAND memory array usually includes programming a plurality of memory cells in a memory cell string from one side of the NAND memory array adjacent to a common source line along the direction toward a bit line one by one. Moreover, when the programmed memory cells are read, offset often occurs to the threshold voltage of the memory cells due to a back pattern effect. Therefore, current programming methods prevent an offset of the threshold voltage caused by the back pattern effect by changing the programming order of the memory cells. However, as the programming order of the memory cells is changed, the channel voltage of the memory cell string that does not need to be programmed may be blocked by memory cells having high threshold voltage and cannot be properly increased, thus causing program disturbance.

SUMMARY OF THE INVENTION

The invention provides a memory device and a programming method thereof capable of preventing influence from a back pattern effect, and can reduce program disturbance through the pre-increase of the channel voltage of the memory cells.

A programming method for a memory device of the invention includes the following steps, wherein the memory array in the memory device includes a first memory cell string and a second memory cell string. During a first period, a first voltage from a common source line is transmitted to first ends of the first memory cell string and the second memory cell string, and second ends of the first memory cell string and the second memory cell string are floated. The common source line is located at the first side of the memory array. Moreover, during a second period, the first ends of the first memory cell string and the second memory cell string are floated, a second voltage and a third voltage are respectively transmitted to the second ends of the first memory cell string and the second memory cell string, and a programming voltage and a plurality of passing voltages are applied, so as to inhibit programming of the first memory cell string and sequentially program a plurality of memory cells in the second memory cell string from the second side of a memory array.

A memory device of the invention includes a memory array and a memory controller. The memory array includes a first memory cell string and a second memory cell string. During a first period, the memory controller transmits a first voltage from a common source line to first ends of the first memory cell string and the second memory cell string, and floats second ends of the first memory cell string and the second memory cell string. The common source line is located at the first side of the memory array. During a second period, the memory controller floats the first ends of the first memory cell string and the second memory cell string, and respectively transmits a second voltage and a third voltage to the second ends of the first memory cell string and the second memory cell strings, and applies a programming voltage and a plurality of passing voltages, so as to inhibit programming of the first memory cell string and sequentially program a plurality of memory cells in the second memory cell string from the second side of the memory array.

Based on the above, in the invention, the first voltage from the common source line is transmitted to the first end of the memory cell strings during the first period, and memory cells are sequentially programmed from the second side of the memory array during the second period. Accordingly, influence from a back pattern effect can be prevented, and program disturbance can be reduced through the pre-increase of the channel voltage of the memory cells.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
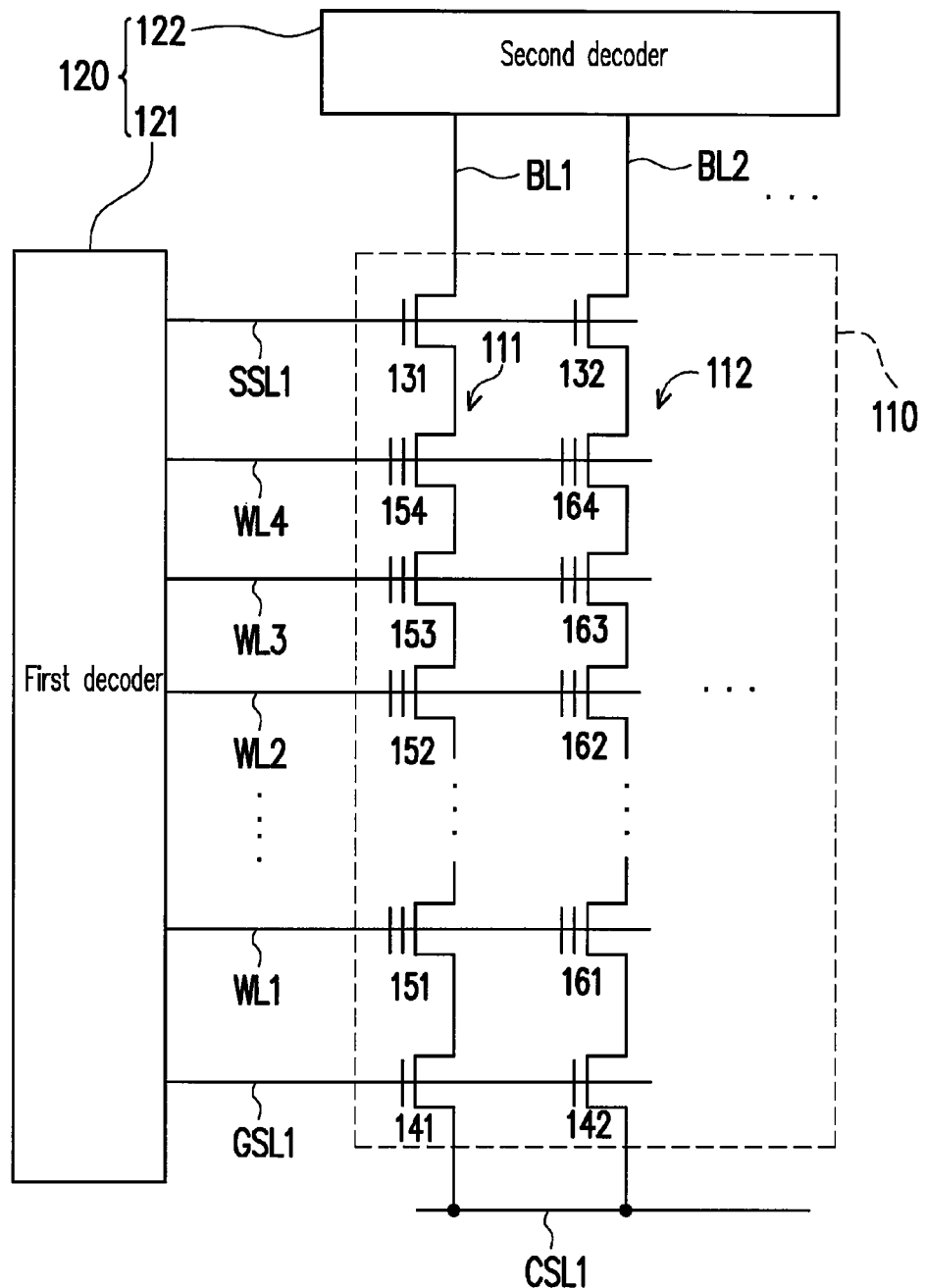
FIG. 1 is a schematic of a memory device according to an embodiment of the invention.

FIG. 1 is a schematic of a memory device according to an embodiment of the invention. As shown in FIG. 1, a memory device 100 includes a memory array 110 and a memory controller 120. The memory array 110 can be, for instance, a NAND memory array, and the memory array 110 includes a plurality of select transistors 131 and 132, a plurality of ground transistors 141 and 142, and a plurality of memory cells 151 to 154 and 161 to 164. The select transistors 131 and 132 are electrically connected to a string select line SSL1, the ground transistors 141 and 142 are electrically connected to a ground select line GSL1, and the memory cells 151 to 154 and 161 to 164 are electrically connected to word lines WL1 to WL4.

The memory cells 151 to 154 are electrically connected in series to form a memory cell string 111. Moreover, the first end of the memory cell string 111 is electrically connected to a common source line CSL1 through the ground transistor 141, and the second end of the memory cell string 111 is electrically connected to a bit line BL1 through the select transistor 131. Similarly, the first end of the memory cell string 112 formed by the memory cells 161 to 164 is electrically connected to the common source line CSL1 through the ground transistor 142, and the second end of the memory cell string 112 is electrically connected to a bit line BL2 through the select transistor 132. In particular, the common source line CSL1 is located at the first side of the memory array 110, and the bit lines BL1 and BL2 are located at the second side of the memory array 110.

The memory controller 120 includes a first decoder 121 and a second decoder 122. The first decoder 121 and the second decoder 122 can select memory cells in the memory array 110 according to an address to perform a programming procedure, a reading procedure, or an erase procedure on the selected memory cells. Moreover, in an embodiment, the memory array 110 can be, for instance, a 2D array structure, and the first decoder 121 and the second decoder 122 can be, for instance, a row decoder and a column decoder. In another embodiment, the memory array 110 can be, for instance, a 3D array structure, the first decoder 121 includes a row decoder and a plane decoder, and the second decoder 122 can be, for instance, a column decoder.

It should be mentioned that, the programming procedure of the memory array 110 includes a precharge operation and a programming operation. A memory cell string (such as the memory cell string 112) in the memory array 110 to be programmed can be regarded as a selected memory cell string, and the remaining memory cell strings (such as the memory cell string 111) can be regarded as non-selected memory cell strings. During a programming operation, the memory controller 120 can program memory cells in the selected memory cell string from a side of the memory array 110 adjacent to a bit line along the direction toward the common source line CSL1 one by one. Moreover, before a programming operation is performed on the selected memory cell string, the memory controller 120 can increase the channel voltage of each of the memory cell strings through the precharge operation. Accordingly, the precharge operation can pre-increase the channel voltage of the non-selected memory cell strings, thus reducing program disturbance of the memory cells.

Figure 2:
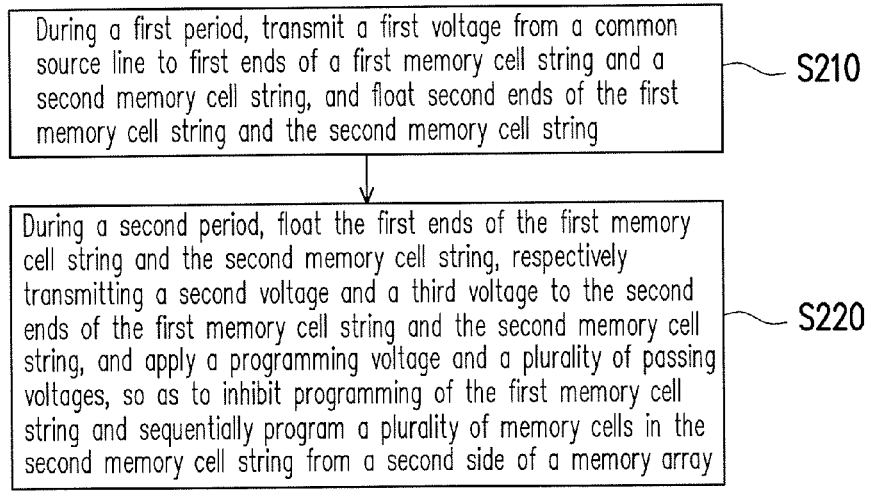
FIG. 2 is a flow chart of a programming method of a memory device according to an embodiment of the invention.

To allow those having ordinary skill in the art to better understand the invention, FIG. 2 is a flow chart of a programming method of a memory device according to an embodiment of the invention. As shown in step S210, during a first period, the memory controller 120 can transmit a first voltage from the common source line CSL1 to the first end of the memory cell string 111 (that is, the first memory cell string), and transmit the first voltage to the first end of the memory string 112 (that is, the second memory cell string). Moreover, the memory controller 120 can float the second ends of the memory cell strings 111 and 112. Accordingly, the memory controller 120 can perform a precharge operation on the memory array 110, so as to increase the channel voltages of the memory cell strings 111 and 112 through the first voltage.

Figure 3:
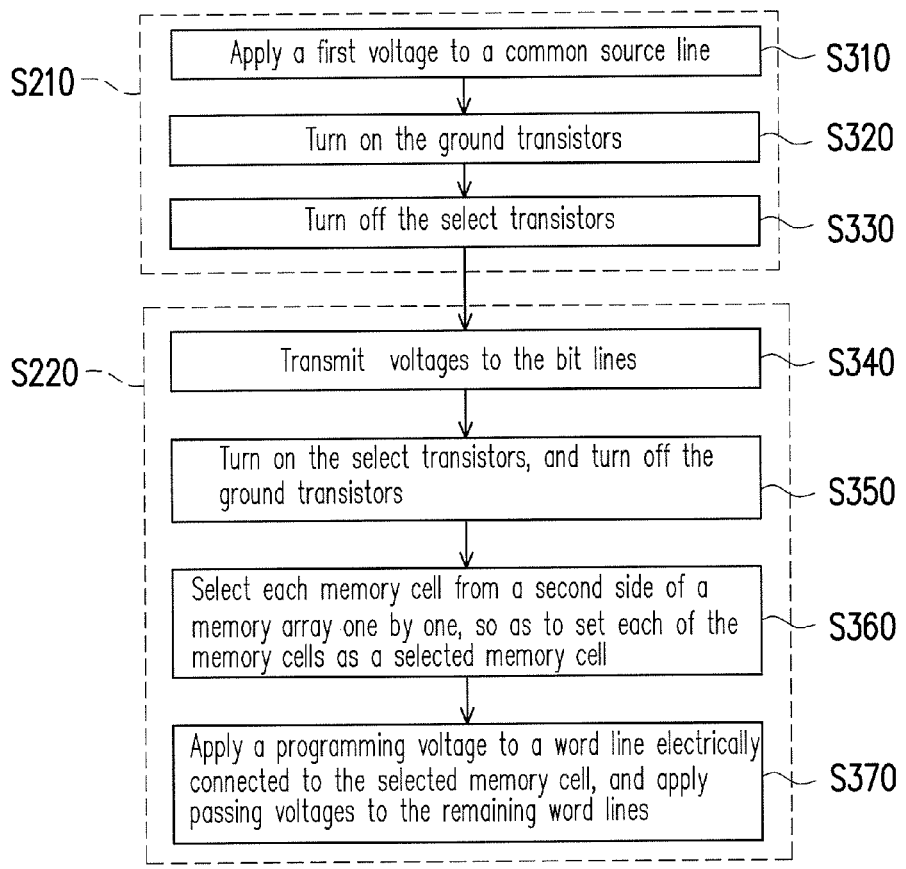
FIG. 3 is a detailed flow chart describing each step of FIG. 2.
Figure 4:
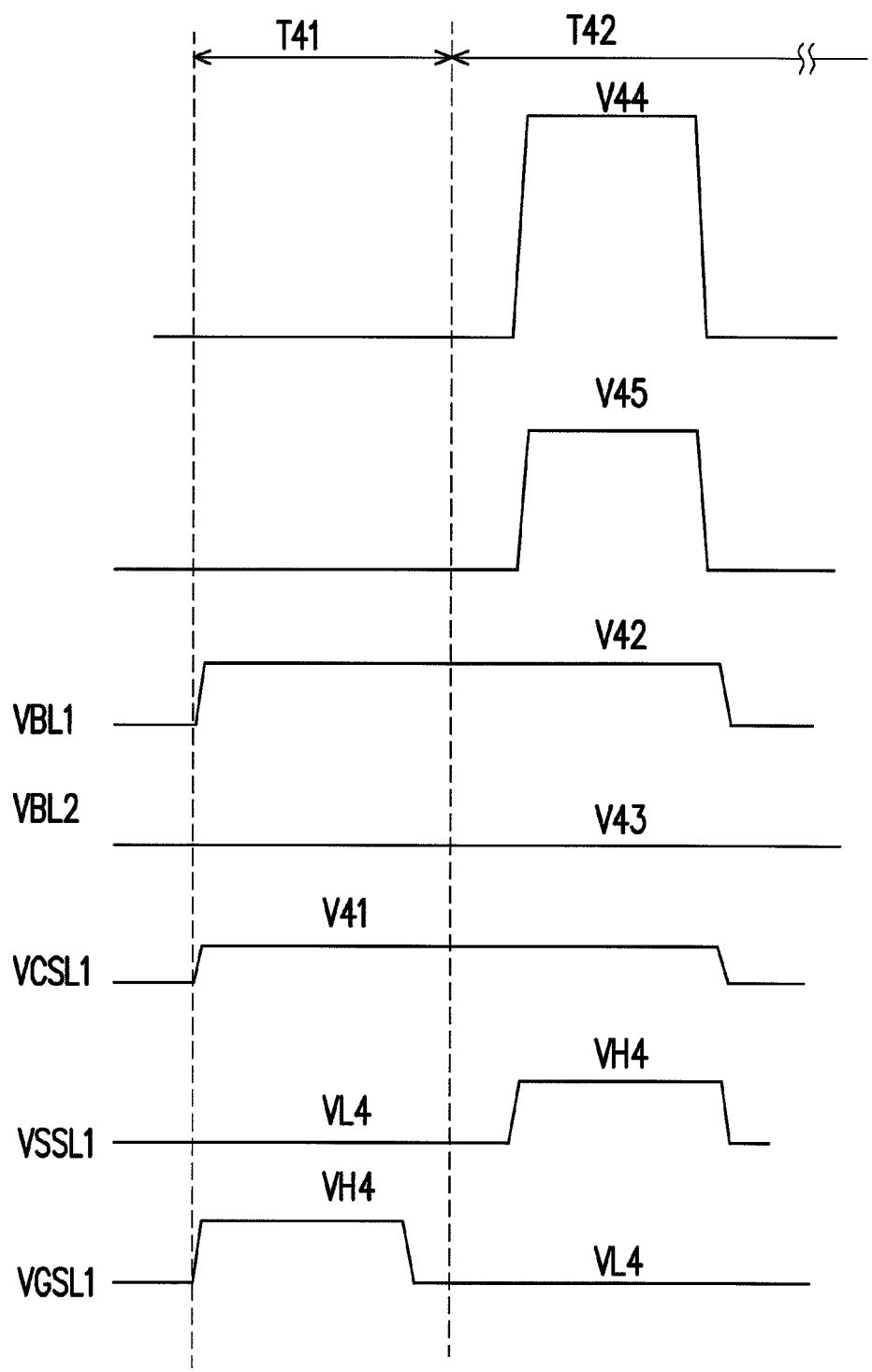
FIG. 4 is a timing diagram for describing a programming method of a memory device according to an embodiment of the invention.

For instance, FIG. 3 is a detailed flow chart for describing each step of FIG. 2, and FIG. 4 is a timing diagram for describing a programming method of a memory device according to an embodiment of the invention. In particular, the labels VBL1, VBL2, VCSL1, VSSL1, and VGSL1 in FIG. 4 are respectively used to represent voltages applied to the bit line BL1, the bit line BL2, the common source line CSL1, the string select line SSL1, and the ground select line GSL1.

In terms of the detailed steps of step S210, as shown in step S310, during a first period T41, the memory controller 120 can apply a first voltage V41 to the common source line CSL1. Moreover, as shown in step S320, the memory controller 120 can apply a high voltage VH4 to the ground select line GSL1 so as to turn on the ground transistors 141 and 142 through the high voltage VH4. Accordingly, the first voltage V41 can be transmitted to the first ends of the memory cell strings 111 and 112 through the ground transistors 141 and 142. Moreover, as shown in step S330, the memory controller 120 can apply a low voltage VL4 to the string select line SSL1, so as to turn off the select transistors 131 and 132, and make the second ends of the memory cell strings 111 and 112 remain in a floating state. In this way, during the first period T41, the memory controller 120 can pre-increase the channel voltages of the memory cell strings 111 and 112 through the first voltage V41.

Referring further to FIG. 1 and FIG. 2, as shown in step S220, during the second period, the memory controller 120 can float the first ends of the memory cell strings 111 and 112, and respectively transmit the second voltage and the third voltage to the second ends of the memory cell strings 111 and 112. Accordingly, the memory cell string 111 can be regarded as a non-selected memory cell string, and the memory cell string 112 can be regarded as a selected memory cell string to be programmed. Moreover, the memory controller 120 can apply a programming voltage and a plurality of passing voltages to inhibit the programming of the memory cell string 111, and sequentially program the memory cells 161 to 164 in the memory cell string 112 from the second side of the memory array 110.

For instance, referring to FIG. 1, FIG. 3, and FIG. 4 at the same time, during the second period T42, as shown in step S340, the memory controller 120 can transmit a second voltage V42 to the bit line BL1, and transmit a third voltage V43 to the bit line BL2. The second voltage V42 can be, for instance, the high voltage VH4 (such as 3.3 volts), and the third voltage V43 can be, for instance, a low voltage (such as 0 volts). Moreover, the first voltage V41 can be, for instance, 2 volts. That is, the first voltage V41 is less than the second voltage V42, and the first voltage V41 is greater than the third voltage V43. Moreover, as shown in step S350, the memory controller 120 can turn off the ground transistors 141 and 142 through the low voltage VL4 transmitted by the ground select line GSL1, and can turn on the select transistors 131 and 132 through the high voltage VH4 transmitted by the string select line SSL1. Accordingly, the first end of the memory cell string 111 is floated, and the second end of the memory cell string 111 can receive the second voltage V42. Similarly, the first end of the memory cell string 112 is floated, and the second end of the memory cell string 112 can receive the third voltage V43.

As shown in step S360, the memory controller 120 can select each of the memory cells in the memory cell string 112 from the second side of the memory array 110 one by one, so as to set each of the memory cells in the memory cell string 112 as a selected memory cell one by one. Moreover, as shown in step S370, the memory array 110 can apply a programming voltage V44 to a word line electrically connected to the selected memory cell, and apply a passing voltage V45 to the remaining word lines. For instance, the memory cell 164 is first selected as a selected memory cell. At this point, the memory controller 120 applies the programming voltage V44 to the word line WL4, and applies the passing voltage V45 to the word lines WL1 to WL3, so as to program the memory cell 164.

In other words, the memory controller 120 applies the programming voltage V44 to the word lines WL1 to WL4 from the second side of the memory array 110 one by one, so as to program the memory cells 161 to 164 one by one.

That is, the memory controller 120 programs the memory cells 161 to 164 in the memory cell string 112 from the top down one by one. Therefore, even in the case that the programmed memory cell 161 has a high threshold voltage, influence to the threshold voltage of the memory cell 161 from a back pattern effect can still be prevented.

Moreover, during the programming of the memory cell string 112 (that is, the selected memory cell string), the channel voltage of the memory cell string 111 (that is, the non-selected memory cell string) is increased in response to the passing voltage. It should be mentioned that, when the memory cell 154 in the memory cell string 111 adjacent to the second side of the memory array 110 has a high threshold voltage, the memory cell 154 blocks an increase in the channel voltage of the memory cell string 111. Moreover, when the channel voltage of the memory cell string 111 is too low, the threshold voltage of the memory cells in the memory cell string 111 is changed due to the influence from the programming of the memory cell string 112, thus causing program disturbance. Therefore, to prevent the above program disturbance, before the programming of the memory cell string 112 is performed, the memory controller 120 can first increase the channel voltage of the memory cell string 111 through a precharge operation. In this way, during the programming process of the memory cell string 112, the memory cell string 111 has a sufficiently high channel voltage to prevent a change to the threshold voltage of the memory cells 151 to 154, thus reducing program disturbance.

Figure 5:
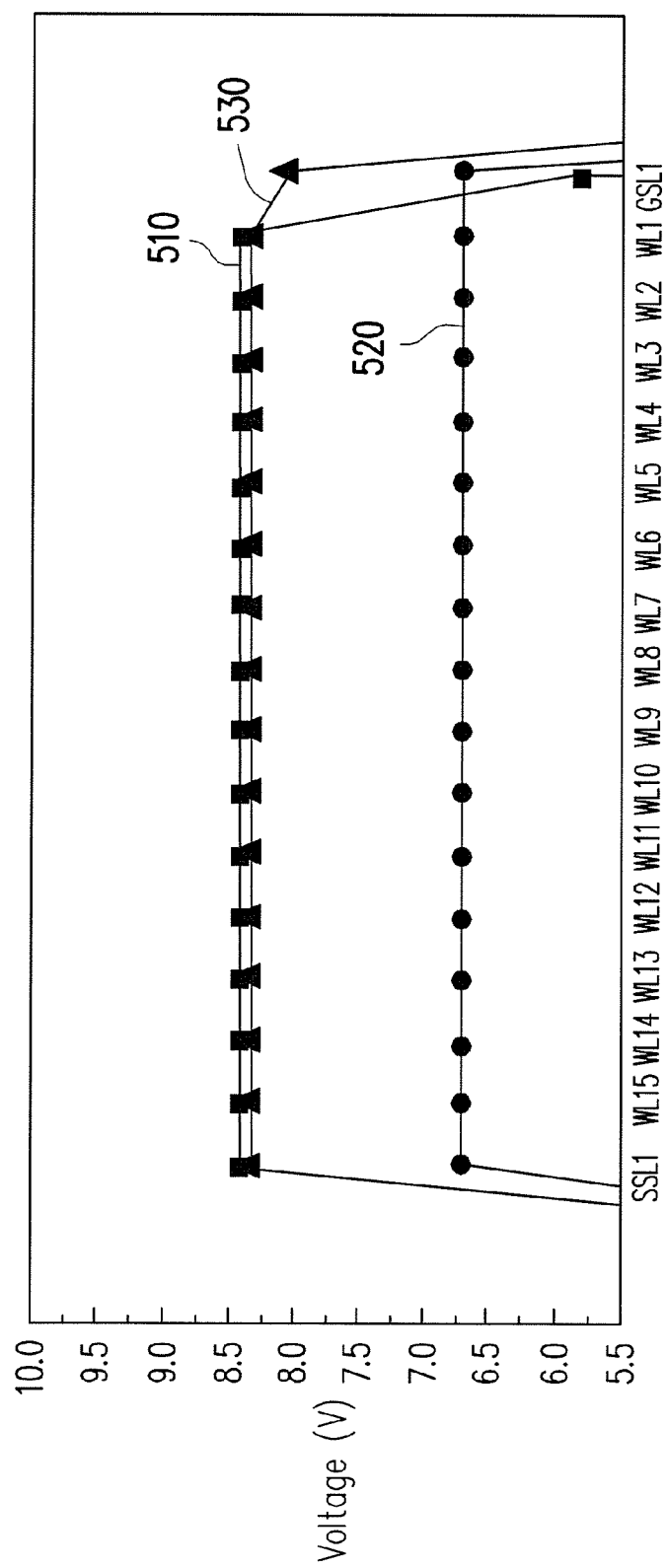
FIG. 5 is a schematic describing a channel voltage of a memory cell string according to an embodiment of the invention.

For instance, FIG. 5 is a schematic describing a channel voltage of a memory cell string according to an embodiment of the invention. In the embodiment of FIG. 5, the memory cell string 111 (that is, the non-selected memory cell string) includes a plurality of memory cells connected to the word lines WL1 to WL15. Moreover, FIG. 5 illustrates the channel voltages of the select transistor 131, the plurality of memory cells, and the ground transistor 141, and the corresponding string select line SSL1, word lines WL1 to WL15, and ground select line GSL1 are labeled along the horizontal axis.

As shown in a curve 510, when the memory controller 120 does not pre-increase the channel voltage of the memory cell string 111, and the memory cell 154 does not have a high threshold voltage, the channel voltage of the memory cell string 111 is increased to about 8.5 volts in response to the passing voltage. Moreover, as shown in a curve 520, when the memory cell 154 has a high threshold voltage, and the memory controller 120 does not pre-increase the channel voltage of the memory cell string 111, the channel voltage of the memory cell string 111 is increased to about 6.7 volts in response to the passing voltage.

Moreover, as shown in a curve 530, when the memory cell 154 has a high threshold voltage, and the memory controller 120 first increases the channel voltage of the memory cell string 111 through a precharge operation, the channel voltage of the memory cell string 111 can be increased to about 8.5 volts in response to the passing voltage. In other words, since the memory controller 120 can first increase the channel voltage of the memory cell string 111 through a precharge operation, during the programming process of the memory cell string 112, the memory cell string 111 has a sufficiently high channel voltage to prevent a change to the threshold voltage of the memory cells 151 to 154, thus reducing program disturbance.

Based on the above, in the invention, the first voltage from the common source line is transmitted to the first ends of the memory cell strings during the first period, so as to pre-increase the channel voltage of the memory cells. In particular, the common source line is located at the first side of the memory array. Moreover, in the invention, memory cells are sequentially programmed from the second side of the memory array during the second period. Accordingly, influence from a back pattern effect can be prevented, and program disturbance can be reduced through the pre-increase of the channel voltage of the memory cells.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A programming method for a memory device, wherein a memory array in the memory device comprises a first memory cell string and a second memory cell string, and the programming method comprises:

transmitting a first voltage from a common source line to first ends of the first memory cell string and the second memory cell string and floating second ends of the first memory cell string and the second memory cell string during a first period, wherein the common source line is located at a first side of the memory array, and channel voltages of the first memory cell string and the second memory cell string are increased in response to the first voltage from the common source line which is simultaneously conducted to the first memory cell string and the second memory cell string; and during a second period, selecting one of the first memory cell string and the second memory cell string each having the increased channel voltage to be programmed by floating the first ends of the first memory cell string and the second memory cell strings, respectively transmitting a second voltage and a third voltage to the second ends of the first memory cell string and the second memory cell string, and applying a programming voltage and a plurality of passing voltages.

2. The programming method as claimed in claim 1, wherein the first ends of the first memory cell string and the second memory cell string are electrically connected to the common source line through a first ground transistor and a second ground transistor, the second ends of the first memory cell string and the second memory cell string are electrically connected to a first bit line and a second bit line through a first select transistor and a second select transistor, and the step of transmitting the first voltage from the common source line to the first ends of the first memory cell string and the second memory cell string and floating the second ends of the first memory cell string and the second memory cell strings during the first period comprises:

applying the first voltage to the common source line;
turning on the first ground transistor and the second ground transistor; and
turning off the first select transistor and the second select transistor.

3. The programming method as claimed in claim 2, wherein the first memory cell string and the second memory cell string are electrically connected to a plurality of word lines, and the step of floating the first ends of the first memory cell stringand the second memory cell string, respectively transmitting the second voltage and the third voltage to the second ends of the first memory cell string and the second memory cell string, and applying the programming voltage and the passing voltages comprises:

respectively transmitting the second voltage and the third voltage to the first bit line and the second bit line;

turning on the first select transistor and the second select transistor, and turning off the first ground transistor and the second ground transistor;

selecting each of the memory cells from the second side of the memory array one by one to set each of the memory cells as a selected memory cell one by one; and applying the programming voltage to the word line electrically connected to the selected memory cell, and applying the passing voltages to the remaining word lines.

4. The programming method as claimed in claim 3, wherein the first select transistor and the second select transistor are electrically connected to a string select line, the first ground transistor and the second ground transistor are electrically connected to a ground select line, and the programming method further comprises:

respectively transmitting a high voltage and a low voltage to the ground select line and the string select line during the first period; and respectively transmitting the low voltage and the high voltage to the ground select line and the string select line during the second period.

5. The programming method as claimed in claim 4, wherein the second voltage is equal to the high voltage and the third voltage is equal to the low voltage.

6. The programming method as claimed in claim 1, wherein the memory array is a NAND memory array.

7. The programming method as claimed in claim 1, wherein the first voltage is less than the second voltage, and the first voltage is greater than the third voltage.

8. A memory device, comprising:

a memory array comprising a first memory cell string and a second memory cell string; and a memory controller, wherein during a first period, the memory controller transmits a first voltage from a common source line to first ends of the first memory cell string and the second memory cell string, and floats second ends of the first memory cell string and the second memory cell string, the common source line is located at a first side of the memory array, and channel voltages of the first memory cell string and the second memory cell string are increased in response to the first voltage from the common source line which is simultaneously conducted to the first memory cell string and the second memory cell string;

during a second period, the memory controller selects one of the first memory cell string and the second memory cell string each having the increased channel voltage to be programmed by floating the first ends of the first memory string and the second memory string, respectively transmitting a second voltage and a third voltage to the second ends of the first memory cell string and the second memory cell string, and applying a programming voltage and a plurality of passing voltages.

9. The memory device as claimed in claim 8, wherein the first ends of the first memory cell string and the second memory cell string are electrically connected to the common source line through a first ground transistor and a second ground transistor, the second ends of the first memory cell string and the second memory cell string are electrically connected to a first bit line and a second bit line through a first select transistor and a second select transistor, and during the first period, the memory controller applies the first voltage to the common source line, and the memory controller turns on the first ground transistor and the second ground transistor, and turns off the first select transistor and the second select transistor.

10. The memory device as claimed in claim 9, wherein the first memory cell string and the second memory cell string are electrically connected to a plurality of word lines, and during the second period, the memory controller applies the second voltage and the third voltage to the first bit line and the second bit line, the memory controller turns on the first select transistor and the second select transistor, and turns off the first ground transistor and the second ground transistor, and the memory controller selects each of the memory cells from the second side of the memory array one by one, so as to set each of the memory cells as a selected memory cell one by one, and the memory controller applies the programming voltage to the word line electrically connected to the selected memory cell, and applies the passing voltages to the remaining word lines.

* * * * *